(12) United States Patent
Tan et al.

(10) Patent No.: US 8,668,991 B2
(45) Date of Patent: Mar. 11, 2014

(54) CURABLE RESINS FOR LED ENCAPSULATION

(71) Applicant: Henkel (China) Company Limited, Shanghai (CN)

(72) Inventors: Wenjuan Tan, Shanghai (CN); Zhiming Pasing Li, Shanghai (CN); Wentao Thomas Xing, Shanghai (CN); Liwei Zhang, Shanghai (CN); Yong Zhang, Shanghai (CN)

(73) Assignee: Henkel (China) Company Limited, Shanghai (CN)

( * ) Notice: Subject to any disclaimer, the term of this patent is extended or adjusted under 35 U.S.C. 154(b) by 0 days.

(21) Appl. No.: 13/796,096

(22) Filed: Mar. 12, 2013

(65) Prior Publication Data

US 2013/0190446 A1    Jul. 25, 2013

Related U.S. Application Data

(63) Continuation of application No. PCT/CN2011/072199, filed on Mar. 28, 2011.

(51) Int. Cl.
*C08G 77/12* (2006.01)
*B32B 9/04* (2006.01)

(52) U.S. Cl.
USPC .......... 428/447; 528/15; 528/13; 528/32; 528/37

(58) Field of Classification Search
None
See application file for complete search history.

(56) References Cited

U.S. PATENT DOCUMENTS

| | | | |
|---|---|---|---|
| 5,656,710 A * | 8/1997 | Newberth et al. | 528/14 |
| 6,442,220 B1 | 8/2002 | Sihlbom | |
| 7,732,526 B2 * | 6/2010 | McNulty et al. | 524/588 |
| 8,198,380 B2 * | 6/2012 | Katayama | 525/477 |
| 2004/0116640 A1 | 6/2004 | Miyoshi | |
| 2006/0081864 A1 | 4/2006 | Nakazawa | |
| 2007/0249790 A1 | 10/2007 | Kashiwagi et al. | |

FOREIGN PATENT DOCUMENTS

| | | |
|---|---|---|
| CN | 1171415 | 7/2006 |
| CN | 1798810 | 7/2006 |
| CN | 100363428 | 1/2008 |
| EP | 1424363 | 6/2004 |

OTHER PUBLICATIONS

International Search Report issued in connection with International Patent Application No. PCT/CN2011/072199 mailed Jan. 12, 2012.

* cited by examiner

*Primary Examiner* — Marc Zimmer
(74) *Attorney, Agent, or Firm* — Steven C. Bauman

(57) ABSTRACT

The present invention relates to a curable organopolysiloxane composition, which comprises:
(A) an organocyclosiloxane having alkenyl groups, represented by the following formula (I)

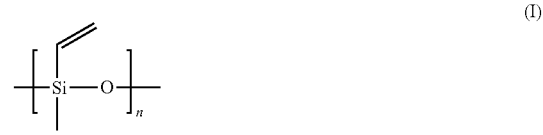

(I)

wherein n=3 or 4;
(B) a hydrosilicone resin of formula (II)

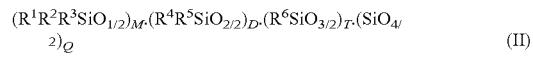

(II)

$(R^1R^2R^3SiO_{1/2})_M \cdot (R^4R^5SiO_{2/2})_D \cdot (R^6SiO_{3/2})_T \cdot (SiO_{4/2})_Q$ wherein $R^1$ to $R^5$ are identical or different groups selected from organic groups and hydrogen atom, and at least one of $R^1$ to $R^5$ is a hydrogen atom directly bonded to a silicon atom, and on average at least two hydrogen atoms directly bonded to silicon atoms are contained in one hydrosilicone resin molecule, $R^6$ is an organic group identical to or different from $R^1$ to $R^5$, as organic groups $R^1$ to $R^6$ may independently be linear/branched alkyl or alkenyl groups having 1-20 carbon atoms or halides thereof; cycloalkyl groups or cycloalkenyl groups having 5-25 carbon atoms or halides thereof;
M, T and Q each represents a number ranging from 0 to less than 1, 0<D<1, M+D+T+Q=1, and T+Q>0; and
(C) platinum-based catalysts.

8 Claims, No Drawings

CURABLE RESINS FOR LED ENCAPSULATION

FIELD OF THE INVENTION

The present invention relates to a curable organopolysiloxane composition which is simple and easily prepared and is used in electrical elements.

BACKGROUND ART

Curable organopolysiloxane compositions can be used in manufacturing optical devices, such as light guiding devices, protective coatings of semiconductor elements, LED encapsulations, etc. Organopolysiloxane compositions cured via hydrosilylation reaction have better heat stability and light stability than those of epoxy systems. Because of their high transparency and high hardness as well as their adhesion to various substrates upon being cured, intensive researches have been conducted on curable organopolysiloxane compositions.

CN100491470C describes a composition of addition-crosslinking siloxane resin comprising (1) 100 parts by weight of a polyorganosiloxane represented by formula $R^1{}_aR^2{}_bR^3{}_cSiO_{(4-a-b-c)/2}$ (I); (2) 50-200 parts by weight of a polyorganosiloxane represented by formula $R^1{}_dH^2{}_eR^3{}_f SiO_{(4-d-e-f)/2}$ (II); or (3) 200 parts by weight of the polyorganosiloxane of the general formula of $R^1{}_gR^2{}_hR^3{}_iH_k SiO_{(4-g-h-i-k)/2}$ (III), which may be used instead of components (1) and (2); (4) 1-100 parts by weight of an alkenyl-rich polyorganosiloxane represented by formula $R^1{}_lR^2{}_mR^3{}_n SiO_{(4-l-m-n)/2}$ (IV); and (5) 1-100 parts by weight of a hydrogen-rich polyorganosiloxane represented by formula $R^1{}_oH_pR^3{}_qSiO_{4-o-p-g)/2}$ (V), which may be used additionally or instead of component (4); and (6) a sufficient amount of catalyst.

EP1424363A1 describes a transparent product having heat stability and discoloration resistance, which is obtained by curing of (A) a silicone resin containing at least two vinyl groups directly bonded to silicon atoms in one molecule; (B) an organohydrosilane or hydropolysilane containing at least two hydrogen atoms directly bonded to silicon atoms in one molecule; with (C) a catalyst for hydrosilylation. This composition comprises the following essential components: a component containing silicon-vinyl groups, a crosslinking agent containing Si—H, and a catalyst. It is used in LED devices for the protection, encapsulation, bonding, wavelength alteration or adjustment, and lens formation.

US20070249790A1 discloses a colorless and transparent polysiloxane lens prepared by thermally curing a silicone resin composition. The silicone resin composition contains (A) an organopolysiloxane having a resin structure comprising $R^1SiO_{1.5}$ unit, $R^2{}_2SiO$ unit and $R^3{}_aR^4{}_bSiO_{(4-a-b)/2}$ unit, wherein $R^1$, $R^2$ and $R^3$ independently are methyl, ethyl, propyl, cyclohexyl or phenyl group, $R^4$ is vinyl or allyl group, a is 0, 1 or 2, b is 1 or 2, a+b is 2 or 3, and the number of $R^2{}_2SiO$ unit is 5-300, (B) an organohydropolysiloxane having a resin structure comprising $R^1SiO_{1.5}$ unit, $R^2{}_2SiO$ unit and $R^3{}_cH_dSiO_{(4-c-d)/2}$ unit, wherein c is 0, 1 or 2, d is 1 or 2, and c+d is 2 or 3, and the number of $R^2{}_2SiO$ unit is 5-300, and (C) a platinum-based catalyst. A polysiloxane lens having good flexibility, transparency and plasticity with low surface tackiness was provided.

CN100363428C discloses a LED encapsulating composition, which comprises: polyorganosiloxane components (A) and (B), including at least one polyorganosiloxane, and the average composition of the mixture of polyorganosiloxanes is represented by $(R^1R^2R^3SiO_{1/2})_{M'}(R^4R^5SiO_{2/2})_{D'} (R^6SiO_{3/2})_{T'}(SiO_{4/2})_Q$, wherein $R^1$ to $R^6$ are identical or different groups selected from the group consisting of organic groups, hydroxyl group and hydrogen atom, and at least one of $R^1$ to $R^6$ is a hydrocarbon group with a multiple bond and/or a hydrogen atom, M, D, T and Q each represent a number ranging from 0 to less than 1, M+D+T+Q=1, and Q+T>0; (C) effective amount of a catalyst for addition reaction. The document describes a composition comprising a mixture of several silicon-vinyl components and several Si—H components.

From the above documents, there can be seen a trend of using complex combinations of various components when hardness and transparency are needed. However, the complexity of compositions, especially the complexity of the silicon-vinyl components in curable organopolysiloxane compositions results in extremely high costs and complicated manufacturing processes effecting fluctuant viscosity within the final products.

SUMMARY OF THE INVENTION

The object of the invention is to provide a composition, which is curable via hydrosilylation and after curing exhibits high transparency, high hardness, light stability and heat stability. Furthermore, the composition shall be easy to prepare and the viscosity of the composition shall be reliably adjustable. This is achieved by providing a composition as set forth hereinafter.

The present invention relates to a siloxane resin composition, which comprises:

(A) at least one organocyclosiloxane having alkenyl groups, represented by the following formula (I)

wherein n=3 or 4;

(B) at least one hydrosilicone resin of formula (II)

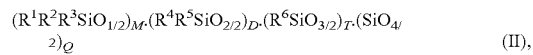

wherein $R^1$ to $R^5$ are identical or different groups selected from organic groups and a hydrogen atom, at least one of $R^1$ to $R^5$ is a hydrogen atom directly bonded to a silicon atom, and on average at least two hydrogen atoms directly bonded to silicon atoms are contained in one hydrosilicone resin molecule; $R^6$ is an organic group identical to or different from $R^1$ to $R^5$, organic groups $R^1$ to $R^6$ each independently are linear or branched alkyl or alkenyl groups having 1-20 carbon atoms, respectively, or halides of such linear or branched alkyl or alkenyl groups, or cycloalkyl groups or cycloalkenyl groups having 5-25 carbon atoms, respectively, or halides of such cycloalkyl groups or cycloalkenyl groups;

M, T and Q each represent a number ranging from 0 to less than 1, 0<D<1, M+D+T+Q=1, and T+Q>0;

(C) a catalytic amount of at least one curing catalyst.

Furthermore, the present invention relates to a cured silicone resin obtainable by heating a siloxane resin composition according to the present invention.

According to the present invention, large molecule silicone resins are obtained via hydrosilylation using small molecule silicone-vinyl components and Si—H components. The preparation process of said silicone resins is simple and well reproducible.

The present invention further relates to the use of a siloxane resin composition according to the present invention as semiconductor encapsulating material and/or electronic elements packaging material.

DETAILED DESCRIPTION

According to the present invention, silicone resins are obtained by homogeneously mixing methylvinylcyclosiloxanes with hydrosilicone resins, and then allowing them to undergo hydrosilylation reaction in the presence of catalysts.

Organocyclosiloxanes used in the present invention are commercially available, e. g. from Gelest company.

Hydrosilicone resins used in the present invention comprise at least two hydrogen atoms directly bonded to silicon atoms on average in one molecule. $R^6$ according to formula (II) is an organic group identical to or different from $R^1$ to $R^5$. Organic groups $R^1$ to $R^6$ independently are linear/branched alkyl or alkenyl groups having 1-20 carbon atoms or halides thereof or cycloalkyl groups and cycloalkenyl groups having 5-25 carbon atoms or halides thereof. Preferably, the organic groups $R^1$ to $R^6$ each independently are methyl, ethyl, n-propyl, isopropyl, n-butyl, isobutyl, tert-butyl, hexyl, cyclohexyl, phenyl, octyl, dodecyl, cetyl. The molecular weight of the hydrosilicone resins according to the present invention preferably is 10,000-300,000 and more preferably 10,000-100,000 g/mol (GPC, standard: polystyrene); their viscosity is preferably 0.1-40 Pa·s at 25° C. and more preferably 0.5-12 Pa·s at 25° C. (Brookfield DV-+Digital Viscometer/LV, (spindle S64, rotation speed 50 rpm)).

The content of hydrogen atoms directly bonded to silicon atoms of the hydrosilicone resins used in the present invention preferably is 0.1-1.0 wt % and more preferably 0.2-0.6 wt % based on the weight of the hydrosilicone resin.

According to the present invention, catalysts preferably are those commonly used in the hydrosilylation of silicone-vinyl components and Si—H components.

Preferably, said catalysts are one or more selected from the group consisting of chloroplatinic acid, allylsiloxane-platinum complex catalysts, supported platinum catalysts, methylvinylsiloxane-platinum complex catalysts, reaction products of dicarbonyldichloroplatinum and 2,4,6-triethyl-2,4,6-trimethylcyclotrisiloxane.

The dosage of catalysts is preferably such that the platinum content is 1-500 ppm, and more preferably 2-100 ppm, based on the total weight of the siloxane resin composition. The term "platinum content" only refers to the content of platinum itself, even if in the siloxane resin composition of the present invention platinum exists as a complex compound.

In the siloxane resin composition of the present invention, the molar ratio of Si—H groups of the hydrosilicone resin(s) to vinyl groups of the silicone-vinyl component(s) according to the present invention preferably is 0.5-2.5, and more preferably 1.0-2.0.

The present invention further provides a process for the preparation of the siloxane resin composition according to the invention, wherein vinylsiloxanes, hydroorganosilicone resins and catalyst are mixed by means of any mixing device being commonly used in the art.

Heating of the siloxane resin composition according to the present invention to provide the curing of the composition is preferably carried out at 80-180° C. for more than 1 hour.

The reagents and starting materials used in the present invention may advantageously be commercially available.

The advantages of the present invention lie in that 1) the silicon-vinyl component is an organosilicon compound or a mixture of organosilicon compounds, which are simple and readily available, 2) the formula of the composition is very simple, 3) the viscosity of the final composition is stable and repeatable, and 4) after curing the composition has high transparency, high hardness, very good light stability and heat stability.

EXAMPLES

The present invention is further illustrated by way of example without limiting the present invention to the examples. In the following examples, the viscosity is measured on a Brookfield DV-+Digital Viscometer/LV at a temperature of 25° C. (spindle S64, rotation speed 50 rpm), and the weight average molecule weights were measured by GPC and calculated as polystyrene.

The methylvinylcyclosiloxanes used in the examples were:
Trimethyltrivinylcyclotrisiloxane, SIT8737.0, from Gelest Company, with a molecule weight of 258.50, boiling point being 80° C./20 mm, RI (at 25° C.) being 1.4215;
Tetramethyltetravinylcyclotetrasiloxane, SIT7900.0, from Gelest Company, with a molecule weight of 344.66, boiling point being 110° C./10 mm (−43° C. mp), RI (at 20° C.) being 1.4342.

The organosilicone resins having silanol group used in the examples were:
KR 220L, an organosilicone resin from Shinetsu Company;
MK, an organosilicone resin from Wacker Company;
SQO-299, an organosilicone resin from Gelest Company.

The hydrosilicone oils used in the examples were:
7672 from Dow Corning, with a hydrogen content of 0.9%, a weight average molecule weight of 17,000, a dynamic viscosity at 25° C. of 70 mPa·S;
7048 from Dow Corning, with a hydrogen content of 1.58-1.60%, a weight average molecule weight of 4,000-5,000, a dynamic viscosity at 25° C. of 30 mPa·S;
1-3502 from Dow Corning, with a hydrogen content of 0.36%, a weight average molecule weight of 1,028, a dynamic viscosity at 25° C. of 7.2 mPa·S;
6-3570 from Dow Corning, with a hydrogen content of 0.78-0.82%, a weight average molecule weight of 747, a dynamic viscosity at 25° C. of 5 mPa·S.

Synthetic Example HSR-1

10.0 g MK, 5.0 g 6-3570, 5.0 g 1-3502, and 80.0 g ethyl acetate were added into a three-necked flask. Gaseous ammonia was blown into the mixture for 5 min, and then the mixture was heated to 60° C. for 4 hours. Ethyl acetate was removed via rotary evaporation, and a hydrosilicone resin was obtained. The viscosity of the resulting hydrosilicone resin was 0.5 Pa·s/25° C., and its hydrogen content was 2.5 mmol/g. The resulting resin had a weight average molecule weight of 15,462.

Synthetic Example HSR-2

10.0 g MK, 10.0 g 1-3502 and 80.0 g ethyl acetate were added into a three-necked flask. Gaseous ammonia was blown into the mixture for 5 min, and then the mixture was heated to 60° C. for 4 hours. Ethyl acetate was removed via rotary evaporation, and a hydrosilicone resin was obtained. The viscosity of the resulting hydrosilicone resin was 2.82

Pa·s/25° C., and its hydrogen content was 1.6 mmol/g. The resulting resin had a weight average molecule weight of 32,939.

Synthetic Example HSR-3

10.0 g MK, 5 g 7048, 5.0 g 1-3502, and 80.0 g ethyl acetate were added into a three-necked flask. Gaseous ammonia was blown into the mixture for 5 min, and then the mixture was heated to 60° C. for 4 hours. Ethyl acetate was removed via rotary evaporation, and a hydrosilicone resin was obtained. The viscosity of the resulting hydrosilicone resin was 5.90 Pa·s/25° C., and its hydrogen content was 4.4 mmol/g. The resulting resin had a weight average molecule weight of 120,607.

Synthetic Example HSR-4

10.0 g MK, 5 g 7048, 5.0 g 7672, and 80.0 g ethyl acetate were added into a three-necked flask. Gaseous ammonia was blown into the mixture for 5 min, and then the mixture was heated to 60° C. for 4 hours. Ethyl acetate was removed via rotary evaporation, and a hydrosilicone resin was obtained. The viscosity of the resulting hydrosilicone resin was 3.30 Pa·s/25° C., and its hydrogen content was 5.66 mmol/g. The resulting resin had a weight average molecule weight of 52,655.

Synthetic Example HSR-5

10.0 g KR220L, 5 g 7048, 5.0 g 7672, and 180.0 g ethyl acetate were added into a three-necked flask. Gaseous ammonia was blown into the mixture for 5 min, and then the mixture was heated to 60° C. for 4 hours. Ethyl acetate was removed via rotary evaporation, and a hydrosilicone resin was obtained. The viscosity of the resulting hydrosilicone resin was 0.1 Pa·s/25° C., and its hydrogen content was 6.0 mmol/g. The resulting resin had a weight average molecule weight of 12,000.

Synthetic Example HSR-6

10.0 g KR220L, 5 g 7048, 5.0 g 1-3502, and 30.0 g ethyl acetate were added into a three-necked flask. Gaseous ammonia was blown into the mixture for 5 min, and then the mixture was heated to 60° C. for 4 hours. Ethyl acetate was removed via rotary evaporation, and a hydrosilicone resin was obtained. The viscosity of the resulting hydrosilicone resin was 2.34 Pa·s/25° C., and its hydrogen content was 3.782 mmol/g. The resulting resin had a weight average molecule weight of 96,611.

Synthetic Example HSR-7

10.0 g MK, 5 g 7048, 5.0 g 7672, and 80.0 g ethyl acetate were added into a three-necked flask. 0.3 g aqueous ammonia was added to the mixture, and then the mixture was heated to 60° C. for 4 hours. Ethyl acetate and the excess aqueous ammonia are removed via rotary evaporation, and a hydrosilicone resin was obtained. The viscosity of the resulting hydrosilicone resin was 1.45 Pa·s/25° C., and its hydrogen content was 6.33 mmol/g. The resulting resin had a weight average molecule weight of 15,301.

Synthetic Example HSR-8

10.0 g MK, 10.0 g 7672, and 80.0 g ethyl acetate were added into a three-necked flask. 0.075 g aqueous ammonia was added to the mixture, and then the mixture was heated to 60° C. for 4 hours. Ethyl acetate and the excess aqueous ammonia are removed via rotary evaporation, and a hydrosilicone resin was obtained. The viscosity of the resulting hydrosilicone resin was 0.29 Pa·s/25° C., and its hydrogen content was 8.34 mmol/g. The resulting resin had a weight average molecule weight of 14,276.

Example 1

1.32 g trimethyltrivinylcyclotrisiloxane, 9.0 g hydrosilicone resin prepared in Synthetic example HSR-1 with a hydrogen content of 2.5 mmol/g and a Si—H/Si-Vinyl ratio of 1.5, 0.01 g 3,5-dimethyl-1-hexyn-3-ol as reaction inhibitor, and platinum-divinyltetramethyldisiloxane complex as a catalyst with the platinum content being controlled at 80 ppm (by weight) are sufficiently stirred, mixed and defoamed. The mixture was cured under 150° C. for 5 hours. The hardness of the resulting silicone resin after curing was shore A 80, and the transparency at 400 nm was 86%.

Example 2

1.26 g trimethyltrivinylcyclotrisiloxane, 9.0 g hydrosilicone resin prepared in Synthetic example HSR-2 with a hydrogen content of 1.6 mmol/g and a Si—H/Si-Vinyl ratio of 1.0, 0.01 g 3,5-dimethyl-1-hexyn-3-ol as reaction inhibitor, and platinum-diethyltetramethyldisiloxane complex as a catalyst with the platinum content being controlled at 60 ppm (by weight) are sufficiently stirred, mixed and defoamed. The mixture was cured under 150° C. for 16 hours. The hardness of the resulting silicone resin after curing was shore A 87, and the transparency at 400 nm was 78%.

Example 3

4.64 g tetramethyltetravinylcyclotetrasiloxane, 6.0 g hydrosilicone resin prepared in Synthetic example HSR-3 with a hydrogen content of 4.4 mmol/g and a Si—H/Si-Vinyl ratio of 0.5, 0.01 g 3,5-dimethyl-1-hexyn-3-ol as reaction inhibitor, and platinum-divinyltetramethyldisiloxane complex as a catalyst with the platinum content being controlled at 30 ppm (by weight) are sufficiently stirred, mixed and defoamed. The mixture was cured under 150° C. for 3 hours. The hardness of the resulting silicone resin after cure was shore A 83, and the transparency at 400 nm was 92.0%.

Example 4

2.4 g trimethyltrivinylcyclotrisiloxane, 10.0 g hydrosilicone resin prepared in Synthetic example HSR-4 with a hydrogen content of 5.5 mmol/g and a Si—H/Si-Vinyl ratio of 2.0, 0.01 g 3,5-dimethyl-1-hexyn-3-ol as reaction inhibitor, and platinum-divinyltetramethyldisiloxane complex as a catalyst with the platinum content being controlled at 15 ppm (by weight) are sufficiently stirred, mixed and defoamed. The mixture was cured under 150° C. for 1.5 hours. The hardness of the resulting silicone resin after curing was shore A 94, and the transparency at 400 nm was 95.6%.

Example 5

2.1 g trimethyltrivinylcyclotrisiloxane, 10.0 g hydrosilicone resin prepared in Synthetic example HSR-5 with a hydrogen content of 6.0 mmol/g and a Si—H/Si-Vinyl ratio of 2.5, 0.01 g 3,5-dimethyl-1-hexyn-3-ol as reaction inhibitor, and platinum-divinyltetramethyldisiloxane complex as a catalyst with the platinum content being controlled at 2 ppm (by weight) are sufficiently stirred, mixed and defoamed. The mixture was cured under 150° C. for 18 hours. The hardness of the resulting silicone resin after cure was shore A 93, and the transparency at 400 nm was 94.9%.

Example 6

2.1 g tetramethyltetravinylcyclotetrasiloxane, 10.0 g hydrosilicone resin prepared in Synthetic example HSR-6 with a hydrogen content of 3.8 mmol/g and a Si—H/Si-Vinyl ratio of 1.5, 0.01 g 3,5-dimethyl-1-hexyn-3-ol as reaction inhibitor, and platinum-divinyltetramethyldisiloxane complex as a catalyst with the platinum content being controlled at 100 ppm (by weight) are sufficiently stirred, mixed and defoamed. The mixture was cured under 150° C. for 2 hours. The hardness of the resulting silicone resin after curing was shore A 93, and the transparency at 400 nm was 94.2%.

Example 7

4.4 g tetramethyltetravinylcyclotetrasiloxane, 8.0 g hydrosilicone resin prepared in Synthetic example HSR-7 with a hydrogen content of 6.3 mmol/g and a Si—H/Si-Vinyl ratio of 1.0, 0.01 g 3,5-dimethyl-1-hexyn-3-ol as reaction inhibitor, and platinum-divinyltetramethyldisiloxane complex as a catalyst with the platinum content being controlled at 45 ppm (by weight) are sufficiently stirred, mixed and defoamed. The mixture was cured under 180° C. for 1 hour. The hardness of the resulting silicone resin after curing was shore A 94, and the transparency at 400 nm was 94.8%.

Example 8

3.88 g tetramethyltetravinylcyclotetrasiloxane, 8.0 g hydrosilicone resin prepared in Synthetic example HSR-8 with a hydrogen content of 8.3 mmol/g and a Si—H/Si-Vinyl ratio of 1.5, 0.01 g 3,5-dimethyl-1-hexyn-3-ol as reaction inhibitor, and platinum-divinyltetramethyldisiloxane complex as a catalyst with the platinum content being controlled at 30 ppm (by weight) are sufficiently stirred, mixed and defoamed. The mixture was cured under 150° C. for 15 hours. The hardness of the resulting silicone resin after curing was shore A 90, and the transparency at 400 nm was 94.5%.

Example 9

3.24 g tetramethyltetravinylcyclotetrasiloxane, 8.0 g hydrosilicone resin prepared in Synthetic example HSR-5 with a hydrogen content of 6.0 mmol/g and a Si—H/Si-Vinyl ratio of 1.3, 0.01 g 3,5-dimethyl-1-hexyn-3-ol as reaction inhibitor, and platinum-divinyltetramethyldisiloxane complex as a catalyst with the platinum content being controlled at 30 ppm (by weight) are sufficiently stirred, mixed and defoamed. The mixture was cured under 80° C. for 15 hours. The hardness of the resulting silicone resin after curing was shore A 75, and the transparency at 400 nm was 93.2%.

What is claimed is:
1. A siloxane resin composition, comprising
(A) at least one organocyclosiloxane represented by the following formula (I)

wherein n=3 or 4;
(B) at least one hydrosilicone resin of formula (II)

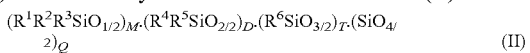

wherein $R^1$ to $R^5$ are identical or different groups selected from organic groups and hydrogen atom, and at least one of $R^1$ to $R^5$ is a hydrogen atom directly bonded to a silicon atom, and on average at least two hydrogen atoms directly bonded to silicon atoms are contained in one hydrosilicone resin molecule, $R^6$ is an organic group identical to or different from $R^1$ to $R^5$, organic groups $R^1$ to $R^6$ each independently are linear or branched alkyl or alkenyl groups having 1-20 carbon atoms, respectively, or halides of such alkyl or alkenyl groups, or cycloalkyl groups or cycloalkenyl groups having 5-25 carbon atoms, respectively, or halides of such cycloalkyl or cycloalkenyl groups;

M, T and Q each represent a number ranging from 0 to less than 1, 0<D<1, M+D+T+Q=1, and T+Q>0; and
(C) a catalytic amount of at least one curing catalyst.

2. The siloxane resin composition of claim 1, wherein the molar Si—H/Si-Vinyl ratio is 0.5-2.5, and preferably 1.0-2.0.

3. The siloxane resin composition of claim 1, wherein the weight average molecular weight of the hydrosilicone resin is 10,000-300,000 g/mol, preferably 10,000-100,000 g/mol.

4. The siloxane resin composition of claim 1, wherein the hydrogen content of the hydrosilicone resin is 0.1-1.0 wt %, preferably 0.2-0.6 wt %.

5. The siloxane resin composition of claim 1, which is characterized in that the catalysts used in the hydrosilylation of silicone-vinyl components and Si—H components are one or more selected from the group consisting of chloroplatinic acid, allylsiloxane-platinum complex catalysts, supported platinum catalysts, methylvinylsiloxane-platinum complex catalysts, reaction products of dicarbonyldichloroplatinum and 2,4,6-triethyl-2,4,6-trimethylcyclotrisiloxane.

6. The siloxane resin composition of claim 1, wherein the content of platinum is 1-500 ppm, and more preferably 2-100 ppm, based on the total weight of the siloxane resin composition.

7. A cured silicone resin obtainable by heating a siloxane resin composition according to claim 1.

8. A method of encapsulating a semiconductor comprising coating the semiconductor with the siloxane resin composition of claim 1.

* * * * *